(12) United States Patent
Kwan et al.

(10) Patent No.: US 7,125,750 B2
(45) Date of Patent: Oct. 24, 2006

(54) LEADFRAME WITH ENHANCED ENCAPSULATION ADHESION

(75) Inventors: Yiu Fai Kwan, Tsuen Wan (HK); Wai Chan, Tin Shui Wai (HK)

(73) Assignee: ASM Assembly Materials Ltd. (SG)

( * ) Notice: Subject to any disclaimer, the term of this patent is extended or adjusted under 35 U.S.C. 154(b) by 66 days.

(21) Appl. No.: 10/994,790

(22) Filed: Nov. 22, 2004

(65) Prior Publication Data

US 2006/0110855 A1    May 25, 2006

(51) Int. Cl.
*H01L 21/44* (2006.01)
*H01L 21/48* (2006.01)
*H01L 21/50* (2006.01)

(52) U.S. Cl. .................. 438/123; 438/107; 257/666

(58) Field of Classification Search ........... 438/107, 438/108, 111, 123; 257/666, 667, 734, 735, 257/736
See application file for complete search history.

(56) References Cited

U.S. PATENT DOCUMENTS 4,946,518 A    8/1990   Spanjer et al. ............. 148/282
5,459,103 A   10/1995   Kelleher et al. ........... 437/209
5,916,696 A *  6/1999   Abys et al. ................ 428/670

FOREIGN PATENT DOCUMENTS

EP    91308157.6    9/1991

* cited by examiner

*Primary Examiner*—Phuc T. Dang
(74) *Attorney, Agent, or Firm*—Ostrolenk, Faber, Gerb & Soffen, LLP

(57) ABSTRACT

A leadframe having a metallic substrate and comprising layers of plated material, and a method of manufacturing said leadframe are provided. The substrate is plated with a layer of oxidizable material comprising nickel and a noble metal is selectively plated on the layer of oxidizable material. Thereafter, an exposed portion of the oxidizable material that is not plated with the noble metal is passivated to enhance adhesion of an encapsulation compound molded to the leadframe.

19 Claims, 4 Drawing Sheets

LEADFRAME WITH ENHANCED ENCAPSULATION ADHESION

FIELD OF THE INVENTION

The invention relates to leadframes commonly used as carriers of semiconductor or integrated circuit chips during the production of semiconductor devices, and in particular to leadframes with surfaces comprising layers of plated material.

BACKGROUND AND PRIOR ART

During the production of semiconductor devices, leadframes are traditionally used as a cost-effective way to mount and process a plurality of semiconductor dice or chips concurrently. Each leadframe typically has a plurality of die pads for mounting the said chips. The leadframe also acts as a means to electrically connect the chip to external devices via leads of the leadframe. Bonding wires are connected to electrical contacts found on the chip and said leads of the leadframe in a process known as wire bonding. The wires usually comprise gold, aluminum or copper material.

After the chips are mounted onto the leadframe and the bonding wire connections are made between the chips and the leadframe, each chip has to be protected from the environment by encapsulating it with a plastic molding compound, such as epoxy molding compound ("EMC"). Each encapsulated chip constitutes a semiconductor package. The multiple semiconductor packages are then diced or singulated to form individual semiconductor devices.

It is important that adhesion between the leadframe material and the molding compound is strong. In the case of copper-based leadframes, adhesion may be reduced due to a layer of copper oxide forming on the surfaces of the leadframe. The problems associated with this occurrence include delamination of the encapsulant, liquid trapped beneath the encapsulant during packaging and/or liquids seeping or vapors condensing under the encapsulant, leading to mold failure. These problems are addressed in various ways in the prior art. For example, the problems are described in U.S. Pat. No. 4,946,518 entitled "Method for Improving the Adhesion of a Plastic Encapsulant to Copper Containing Leadframes". This patent teaches improving the adhesion of plastic encapsulants to copper leadframes by exposing the copper leadframes to an active oxygen ambient at temperatures below the leadframe annealing temperature. This strengthens any native copper oxide present on the leadframes without increasing the thickness of the leadframes.

In another example, in U.S. Pat. No. 5,459,103 entitled "Method of Forming Lead Frame with Strengthened Encapsulation Adhesion", the leadframe is plated with copper strike and the copper strike is exposed to an oxidizing agent to form a layer of cupric oxide (CuO) that promotes adhesive bonding between the plastic mold and the leadframe.

The above approaches make use of exposed copper on the surface of the leadframe that is oxidizable to form copper oxide in the form of black oxide or brown oxide, which are good adhesion promoters for enhancing adhesion between the leadframe and the molding compound. However, there are certain types of leadframe widely used in the industry that have multiple layers of material plated onto the leadframe, such as pre-plated frames ("PPF"), so that it is not possible or feasible to have a layer of exposed copper that may be oxidized. One type of PPF leadframe is disclosed in European patent number 474,499 entitled "Lead Frame for a Semiconductor Device". The leadframe described has a palladium or palladium-alloy film formed directly on the leadframe or indirectly on the leadframe via an underlying nickel layer. A silver or gold film is further formed on the palladium or palladium-alloy film. These additional layers of material are meant to enhance bondability and solderability of the leadframe surface.

A straight-forward way of manufacturing a PPF leadframe with plated nickel, palladium and gold layers would be to fully plate the leadframe with a layer of nickel film, followed by a layer of palladium film, and thereafter plating it with a layer of gold film. FIG. 1 is a schematic cross-sectional illustration of a PPF leadframe 100 of the prior art comprising full platings of nickel, palladium and gold on a copper-based substrate 110. The leadframe 100 comprises an external leads portion 102 and an internal leads portion 104. Located centrally of the internal leads portion 104 is a die pad 106 on which a semiconductor chip is to be mounted. The die pad 106 and inner leads portion 104 are located in an encapsulation portion 108 that is to be substantially encapsulated with molding compound during molding. The leadframe substrate 110 is fully plated with a layer of nickel 112, followed by a full plating of a layer of palladium 114 and thereafter, a full plating of a layer of gold 116. The problem with this manufacturing approach is that molding compound does not adhere well to nickel, palladium or gold. Without any special mechanism to promote its adhesion, adhesiveness is weak.

Therefore, another prior art construction tries to overcome this disadvantage by selective plating of the nickel, palladium and gold layers in order to expose the underlying copper-based substrate. FIG. 2 is a schematic cross-sectional illustration of a PPF leadframe 120 of the prior art comprising selective plating of nickel, palladium and gold on a copper-based substrate 110. The substrate 110 is selectively plated with a layer of nickel 112, so that some areas of the substrate 110 located within the encapsulation portion 108 are exposed. A layer of palladium 114 is then selectively plated over the layer of nickel 112 leaving the same areas of the substrate 110 exposed. Thereafter, a layer of gold 116 is similarly plated over the layer of palladium 114. The exposed copper in the areas of the substrate 110 that are not covered by plating can then be oxidized to form copper oxide to promote adhesion of the molding compound.

Although this approach is workable to improve adhesion, it is expensive because it involves multiple steps of mechanical masking to selectively plate the nickel, palladium and gold layers. Furthermore, this approach is difficult to implement on a large scale to mass production of such leadframes. An alternative approach of implementing selective plating with the application of photoresist instead of mechanical masking may improve speed and scalability, but incurs high costs.

SUMMARY OF THE INVENTION

It is therefore an object of the invention to seek to provide a leadframe comprising multiple layers of plating material that promotes adhesion of molding compounds to the leadframe that avoids some of the aforesaid disadvantages of the prior art.

According to a first aspect of the invention, there is provided a method of manufacturing a leadframe having a metallic substrate, comprising the steps of: plating the substrate with a layer of oxidizable material comprising nickel, selectively plating a noble metal on the layer of oxidizable material, and thereafter passivating an exposed portion of the oxidizable material that is not plated with the noble metal.

According to a second aspect of the invention, there is provided a leadframe comprising: a metallic substrate, a layer of an oxidizable material comprising nickel plated on the substrate, and a layer of a noble metal selectively plated on the layer of oxidizable material, wherein an exposed portion of the oxidizable material that is not plated with the noble metal is passivated.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a leadframe and its method of manufacture according to the preferred embodiment of the invention will now be described with reference to the accompanying drawings, in which.

DETAILED DESCRIPTION OF THE PREFERRED EMBODIMENTS

Figure 1:
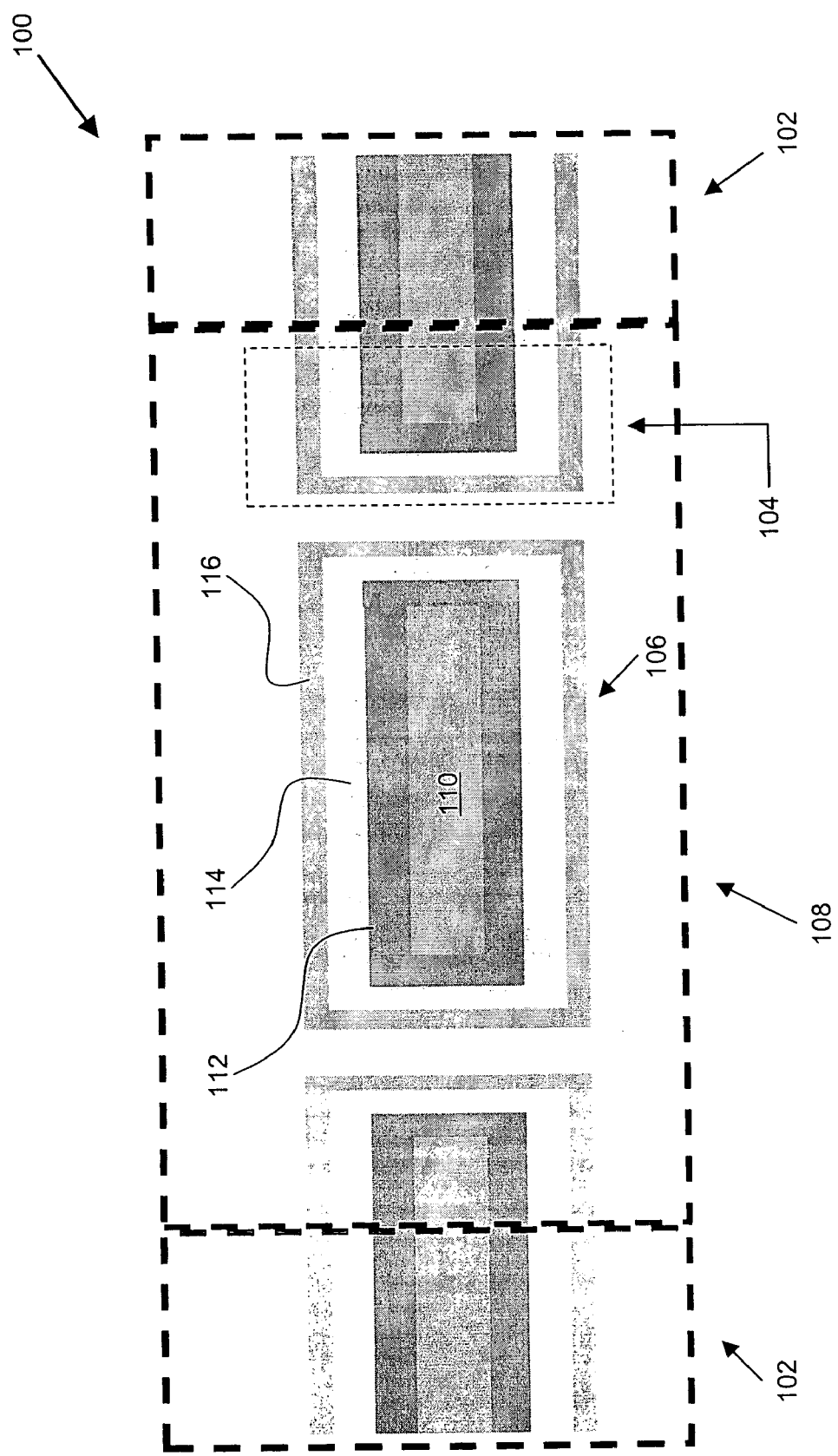
FIG. 1 is a schematic cross-sectional illustration of a PPF leadframe of the prior art comprising full platings of nickel, palladium and gold on a copper-based substrate.
Figure 2:
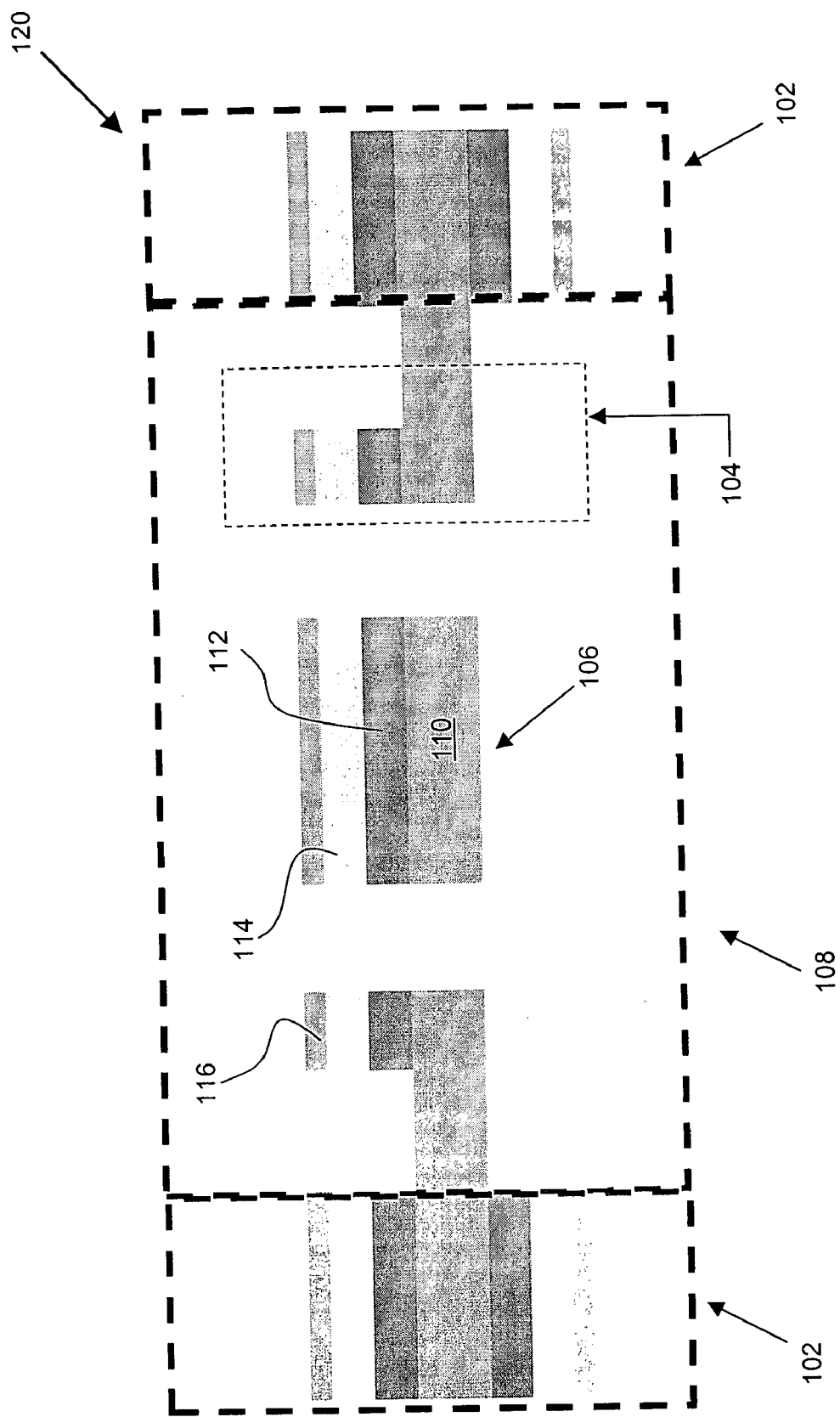
FIG. 2 is a schematic cross-sectional illustration of a PPF leadframe of the prior art comprising selective plating of nickel, palladium and gold on a copper-based substrate.
Figure 3A:
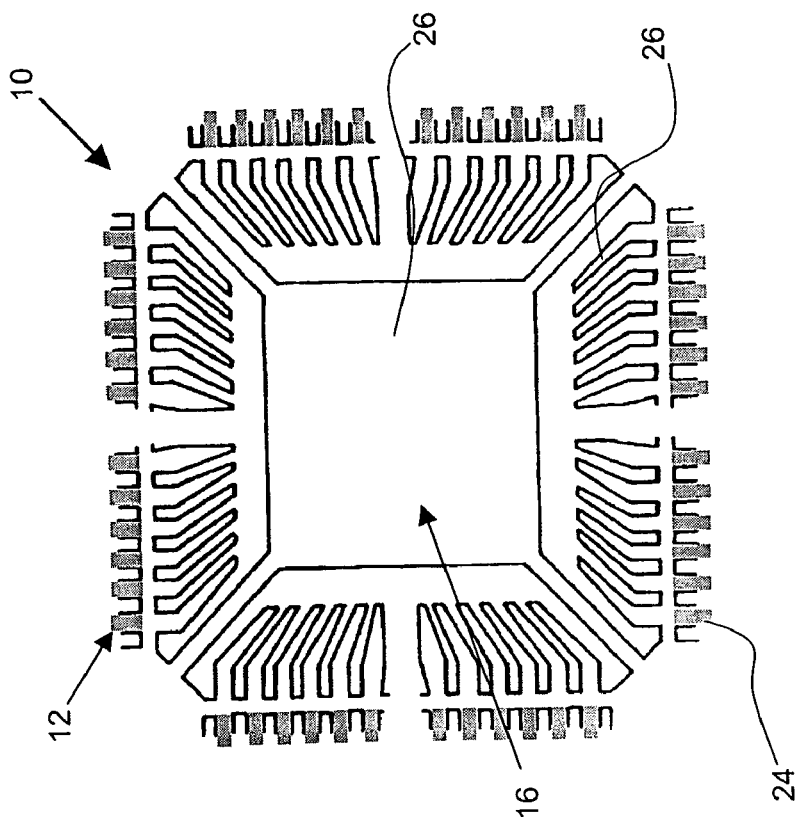
FIG. 3(a) and FIG. 3(b) are plan views of a leadframe according to the preferred embodiment of the invention viewed from a top-side and a bottom side of the leadframe respectively.

FIG. 3(a) and FIG. (b) are plan views of a leadframe 10 according to the preferred embodiment of the invention viewed from a top-side (or die-attach side) and a bottom side of the leadframe 10 respectively. The leadframe 10 comprises an external leads portion 12, internal leads portion 14 and a die pad 16 in the middle of the leadframe 10. During manufacture, the leadframe 10 is first plated with an oxidizable material comprising nickel, and then selectively plated with a noble metal 24, preferably palladium or gold, at areas that require bonding or soldering onto the leadframe, for example, for the purpose of wire bonding. Although the oxidizable material is preferably the element nickel as described in the preferred embodiment of the invention, other oxidizable materials comprising nickel such as alloys constituted by nickel (eg. nickel-iron, nickel-cobalt) may also exhibit properties which are applicable to the invention.

Figure 3B:
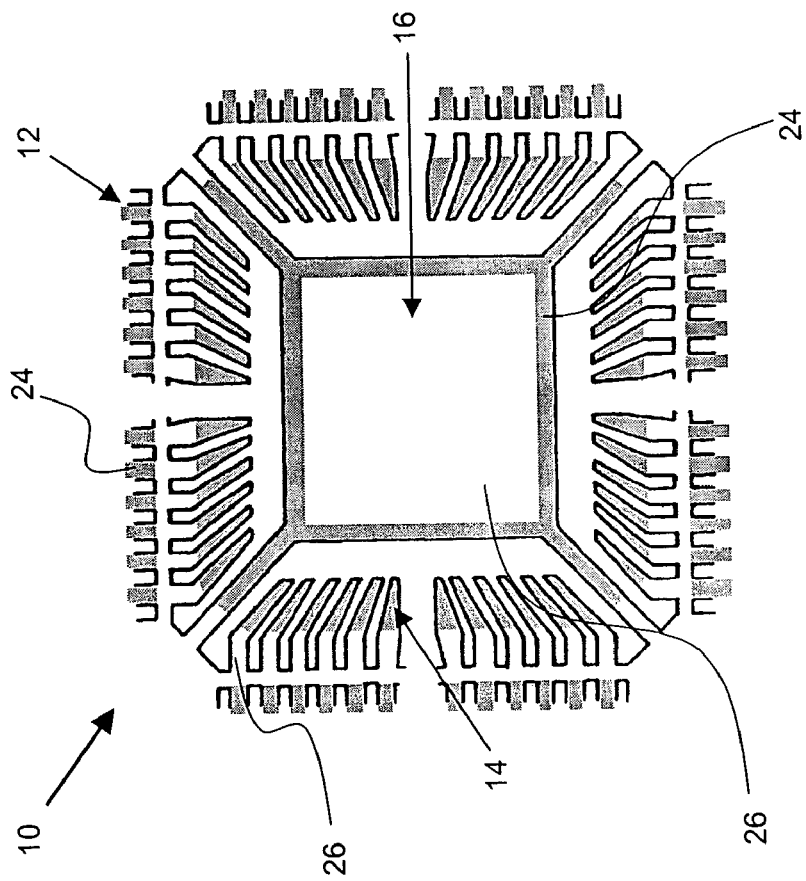

The areas where noble metal 24 is preferably selectively plated are shaded in FIG. 3(a) and FIG. 3(b). Therefore, from the top-side view, noble metal 24 is preferably plated on the external leads portion 12 and the internal leads portion 14. Optionally, the die pad 16 is also partially plated. From the bottom-side view, noble metal 24 is preferably plated on the external leads portion only. The underlying nickel is present to promote bonding and soldering onto the leadframe, whereas the presence of palladium or gold is to protect the underlying nickel.

At the areas not plated with noble metal 24 in the form of palladium or gold, the underlying layer of nickel is exposed. It was found that, unlike nickel metal, passivated nickel such as nickel oxide can reactively enhance adhesion of the molding compound with the leadframe. Thus, the leadframe is treated in the manner described below to form passivated nickel 26 on the exposed portion of the nickel layer not plated by noble metal 24 to enhance adhesion of molding compound.

Figure 4:
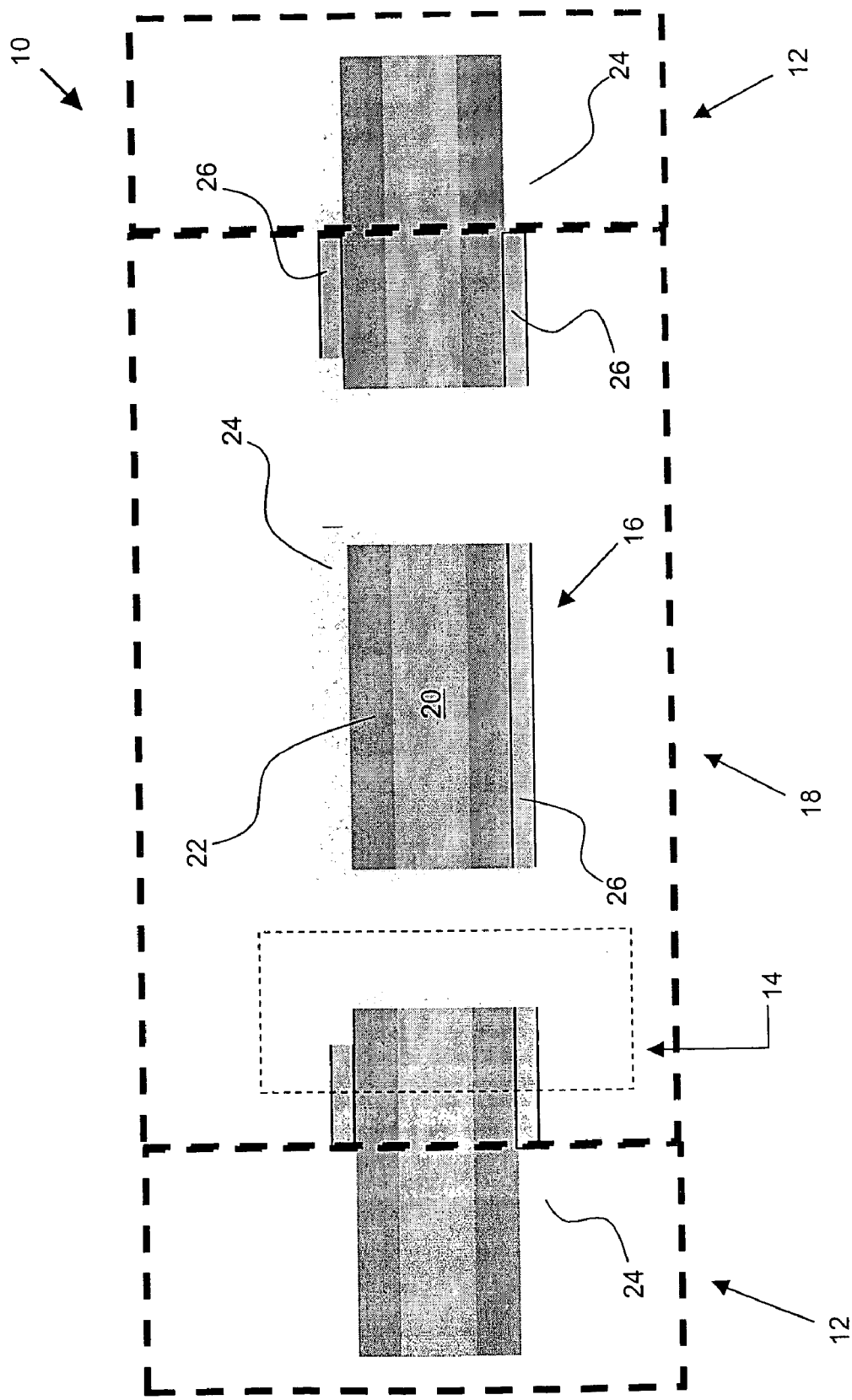
FIG. 4 is a schematic cross-sectional illustration of a structure of a leadframe according to the preferred embodiment of the invention.

FIG. 4 is a schematic cross-sectional illustration of a structure of a leadframe 10 according to the preferred embodiment of the invention. The leadframe 10 comprises the external leads portion 12 and the internal leads portion 14. Located centrally of the internal leads portion 14 is the die pad 16 on which a semiconductor chip is to be mounted. The die pad 16 and inner leads portion 14 are located in an encapsulation portion 18 that is to be substantially encapsulated with molding compound during molding.

The leadframe substrate 20 may be manufactured from any material, such as a copper alloy (examples are CDA194, CDA151, C7025) or a nickel-iron alloy. A nickel layer 22 is first plated on the surface of the leadframe substrate 20. Preferably, the substrate is fully plated with nickel 22. The nickel plated layer 22 can be obtained by immersing the whole leadframe 10 into a plating solution containing nickel sulfamate, nickel sulfate or nickel chloride and applying a cathodic current of between 1–20 amperes per foot. The thickness of the nickel layer is preferably between 0.1 and 100 microinches.

Thereafter, a layer of noble metal 24, such as palladium or gold, is selectively plated on top of the nickel layer in the shaded areas as indicated in FIG. 3.

Selective plating can be done mechanically by using a mask to cover the areas that should not be plated, so as to yield an exposed portion of nickel at the covered areas. Preferably, the thickness of the said palladium or gold layer is between 0.1 and 10 microinches.

After selective plating of the noble metal 24, the exposed nickel at the areas not plated with noble metal should be passivated. Passivated nickel. 26 is thus formed at the exposed areas of the nickel layer 22. Passivation can be carried out in various ways, such as chemically, thermally, via plasma treatment, or a combination thereof.

Using the chemical method, the pre-plated leadframe is treated in an alkaline solution containing one or more of a metallic hydroxide, carbonate, phosphate, nitrite or nitrate. Most preferably, a mixture of sodium hydroxide, sodium triphosphate and sodium nitrite is used. The concentration of such metallic compound is in the range of between 10–200 grams per litre. The treatment temperature is between 50–120° C. The leadframe is immersed in the said alkaline solution and an anodic current density of 0.1–10 ASD is applied for between five seconds and fifteen minutes.

Using the thermal method, the pre-plated leadframe is heated in a temperature of between 100–350° C. in the presence of oxygen, such as in air or in an oxygen-rich environment. The leadframe is preferably so heated for between five seconds and thirty minutes.

Using the plasma treatment method, the leadframe is placed into a plasma chamber, which preferably contains plasma gas and oxygen. It is preferably treated with the gases in the plasma chamber in the presence of oxygen for between five seconds and fifteen minutes.

It should be appreciated that the layer of passivated nickel promotes leadframe adhesion with the molding compound by chemical bonding. Therefore, it may promote adhesion without resorting to producing a rough leadframe surface.

This helps to prevent degradation of solder wetting on external leads. Further, the selective palladium and gold plating can support wire bonding and soldering. Moreover, the above process avoids having to resort to relatively expensive methods of selective plating such as the application of photoresist material, and the manufacturing cost of the leadframe can be thereby reduced.

The invention described herein is susceptible to variations, modifications and/or additions other than those specifically described and it is to be understood that the invention includes all such variations, modifications and/or additions which fall within the spirit and scope of the above description.

The invention claimed is:

1. Method of manufacturing a leadframe having a metallic substrate, comprising the steps of:
   plating the substrate with a layer of oxidizable material comprising nickel,
   selectively plating a noble metal on the layer of oxidizable material to leave a selected exposed portion of the oxidizable material, and thereafter
   passivating the exposed portion of the oxidizable material that is not plated with the noble metal.

2. Method as claimed in claim 1, wherein in the plating of the substrate, the substrate is fully plated with the layer of oxidizable material.

3. Method as claimed in claim 1, wherein the step of passivating the oxidizable material comprises the step of subjecting the leadframe to chemical treatment in an alkaline solution comprising one or more of compounds selected from the group consisting of: metallic hydroxide, metallic carbonate, metallic phosphate, metallic nitrite and metallic nitrate.

4. Method as claimed in claim 3, wherein the alkaline solution comprises a mixture of sodium hydroxide, sodium triphosphate and sodium nitrite.

5. Method as claimed in claim 3, wherein the concentration of the one or more compounds in the alkaline solution is between 10–200 grams per liter.

6. Method as claimed in claim 3, further comprising the step of applying a current density of between 0.1–10 ASD to the alkaline solution and maintaining a temperature of the solution at between 50–120° C.

7. Method as claimed in claim 1, wherein the step of passivating the oxidizable material comprises the step of heating the leadframe in the presence of oxygen at a temperature of 100–350° C. for between 5 seconds and 30 minutes.

8. Method as claimed in claim 1, wherein the step of passivating the oxidizable material comprises the step of subjecting the leadframe to plasma gas in the presence of oxygen for between 5 seconds to 15 minutes.

9. Method as claimed in claim 1, wherein the step of plating the oxidizable material comprises plating the oxidizable material on the leadframe to a thickness of 0.1–100 microinches.

10. Method as claimed in claim 1, wherein the step of plating the noble metal comprises plating the noble metal on the leadframe to a thickness of 0.1–10 microinches.

11. Method as claimed in claim 1, wherein the noble metal comprises palladium or gold.

12. A leadframe produced according to the method as claimed in claim 1.

13. A leadframe comprising:
    a metallic substrate,
    a layer of an oxidizable material comprising nickel plated on the substrate, and
    a layer of a noble metal selectively plated on the layer of oxidizable material to leave an exposed portion, wherein an exposed portion of the oxidizable material that is not plated with the noble metal is passivated.

14. The leadframe as claimed in claim 13, wherein the substrate is fully plated with the layer of oxidizable material.

15. The leadframe as claimed in claim 13, wherein the oxidizable material on the leadframe has a thickness of 0.1–100 microinches.

16. The leadframe as claimed in claim 13, wherein the noble metal on the leadframe has a thickness of 0.1–10 microinches.

17. The leadframe as claimed in claim 13, wherein the noble metal comprises palladium or gold.

18. A semiconductor package comprising the leadframe as claimed in claim 13.

19. Method as claimed in claim 1, wherein the passivating of an exposed portion of the oxidizable material that is not plated with the noble metal is performed by oxidation.

* * * * *